(12) United States Patent
Fukano et al.

(10) Patent No.: US 6,453,458 B1
(45) Date of Patent: *Sep. 17, 2002

(54) SYSTEM AND METHOD FOR GENERATING A FLAT MASK DESIGN FOR PROJECTING A CIRCUIT PATTERN TO A SPHERICAL SEMICONDUCTOR DEVICE

(75) Inventors: Atsuyuki Fukano, Addison, TX (US); Zhiqiang Feng, Nagareyama; Hideki Koide, Tokyo, both of (JP)

(73) Assignee: Ball Semiconductor, Inc., Allen, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 36 days.

This patent is subject to a terminal disclaimer.

(21) Appl. No.: 09/351,203

(22) Filed: Jul. 9, 1999

Related U.S. Application Data (60) Provisional application No. 60/092,442, filed on Jul. 10, 1998.

(51) Int. Cl.[7] .......................... G06F 17/50; G06F 19/00; G06F 7/24; G21K 5/00
(52) U.S. Cl. ......................... 716/21; 700/121; 700/120; 700/98; 430/5; 378/35
(58) Field of Search .............. 716/19–21; 700/117–121, 700/98; 430/4–5; 378/34–35

(56) References Cited

U.S. PATENT DOCUMENTS

| | | | |
|---|---|---|---|
| 4,797,842 A | * 1/1989 | Nackman et al. | 716/20 |
| 4,887,282 A | * 12/1989 | Mueller | 378/34 |
| 5,052,033 A | * 9/1991 | Ikeda et al. | 378/35 |
| 5,253,182 A | 10/1993 | Suzuki | 716/21 |
| 5,257,139 A | * 10/1993 | Higuchi | 359/859 |
| 5,328,784 A | * 7/1994 | Fukuda | 430/5 |
| 5,438,204 A | 8/1995 | von Bunau et al. | 250/492.2 |
| 5,461,455 A | 10/1995 | Coteus et al. | 355/43 |
| 5,793,473 A | 8/1998 | Koyama et al. | 355/55 |
| 5,949,557 A | 9/1999 | Powell | 359/8 |
| 5,955,776 A | * 9/1999 | Ishikawa | 257/218 |
| 6,052,517 A | * 4/2000 | Matsunaga et al. | 716/8 |

FOREIGN PATENT DOCUMENTS

| | | | | |
|---|---|---|---|---|
| JP | 360024016 A | * | 2/1985 | H01L/21/30 |
| JP | 408095231 A | * | 4/1996 | G03F/1/08 |

* cited by examiner

*Primary Examiner*—Matthew Smith
*Assistant Examiner*—Phallaka Kik
(74) *Attorney, Agent, or Firm*—Haynes and Boone, LLP

(57) ABSTRACT

The present invention provides a method for segmenting and mapping a two-dimensional conventional circuit pattern to a flat mask for projection onto a three-dimensional surface. The circuit pattern is first segmented into a plurality of circuit segments enclosed in a plurality of base units of an imposed grid system. Subsequently, locations and the boundary conditions for a plurality of mask segments on the mask are determined such that no unneeded overlapping at the boundaries of the projected image on the spherical shaped semiconductor device is possible. The mask, along with a photolithography system having a plurality of mirrors, projects the circuit pattern onto the spherical shaped semiconductor device.

21 Claims, 5 Drawing Sheets

SYSTEM AND METHOD FOR GENERATING A FLAT MASK DESIGN FOR PROJECTING A CIRCUIT PATTERN TO A SPHERICAL SEMICONDUCTOR DEVICE

CROSS REFERENCE

This application claims the benefit of U.S. Provisional Application Ser. 60/092,442, filed on Jul. 10, 1998.

BACKGROUND OF THE INVENTION

The invention relates generally to photolithography, and more particularly, to a system and method for mapping a two-dimensional flat grid design to a special mask design for further projection onto a three-dimensional object.

Conventional integrated circuits, or "chips," are formed from two dimensional or flat surface semiconductor wafers. The semiconductor wafer is first manufactured in a semiconductor material manufacturing facility and is then provided to a fabrication facility. At the latter facility, several layers are processed onto the semiconductor wafer surface using various design concepts, such as very large scale integrated ("VLSI") design. Although the processed chip includes several layers of materials fabricated thereon, the chip still remains relatively flat.

One of the most important steps of manufacturing the chip is to process the semiconductor substrate through a series of photo lithographical processes so that the VLSI design can be transferred to the relative flat plane of the wafer. Since the VLSI design normally defines the entire circuit design, including different layers of materials such as poly, metal, etc., a plurality of photo masks must be made to facilitate the photolithography for each of those layers. In a conventional mask design process, it is conventional to project the pattern for each layer of material of the entire circuit to a flat glass mask, usually in a rectangular shape. Although several intermediate technical steps are involved, the making of the mask is a straightforward one-to-one projection from the VLSI design to the glass. In other words, the VLSI design is directly projected to the mask.

In U.S. Pat. No. 5,955,776 filed on May 16, 1997, a method and apparatus for manufacturing spherical-shaped semiconductor integrated circuit devices is disclosed. The above patent describes and teaches certain methods for performing photolithography on a spherical substrate.

However, there are numerous problems associated with imaging a two-dimensional circuit design to a three-dimensional object, such as a sphere. Since the circuit design on the mask is projected on the sphere, a conventional mask produced directly from the circuit design does not work well. For example, a rectangular entity on the VLSI design can not maintain its shape while it is projected on the sphere. Thus, direct projection from the VLSI design to the glass mask can no longer be used. A new type of mask design is needed to accommodate the need of producing the circuit on the sphere.

Therefore, what is needed is a system and method for mapping a conventional circuit design onto a special mask for projection onto a three-dimensional surface such as a spherical shaped semiconductor device.

SUMMARY OF THE INVENTION

The present invention, accordingly, provides a system and method for mapping a two-dimensional circuit pattern to a flat mask, which is further projected onto a three dimensional substrate. To this end, one embodiment of the method generates a mask containing a conventional circuit pattern for projection onto a surface of a spherical semiconductor device. The circuit pattern is separated into a plurality of circuit segments, so that each circuit segment is enclosed in a polygonal shape. The circuit segments are then mapped into mask segments. And the boundary conditions for each of the mask segments are adjusted to prevent unnecessary overlapping at boundaries of the projected image on the sphere.

In one embodiment of the invention, the mask has a plurality of radially concentric circular orbits wherein the mapped circuit segments, referred to as mask segments, reside.

An advantage of the present invention is that the mask remains two-dimensional. Therefore, the mask can be made like any conventional mask using the conventional mask making tools.

Another advantage of the present invention is that the circuit pattern can be completed using conventional design tools without excessive concerns about having the circuit design being implemented on a three dimensional surface instead of a flat surface.

DESCRIPTION OF THE EMBODIMENTS

The following disclosure provides many different embodiments, or examples, for implementing different features of the invention. Techniques and requirements that are only specific to certain embodiments should not be imported into other embodiments. Also, specific examples of measurements, quantities, and processes are described below to help clarify the invention. These are, of course, merely examples and are not intended to limit the invention from that described in the claims.

Before continuing, several terms may be defined for better clarity. The set of all points P in space whose distance r is called the "sphere" of radius R and center O. A sphere is a surface and not a solid body, although it may enclose a solid body, which is properly called interior of the sphere. In particular, the center of a sphere is not a point of the sphere but is a point of the interior of the sphere. The section of the sphere made by a plane passing through the center O of the sphere is called a "great circle" (or geodesics) of the sphere. The section of the sphere made by a plane which does not pass through the center of the sphere is called a "small circle" of the sphere.

Figure 1:
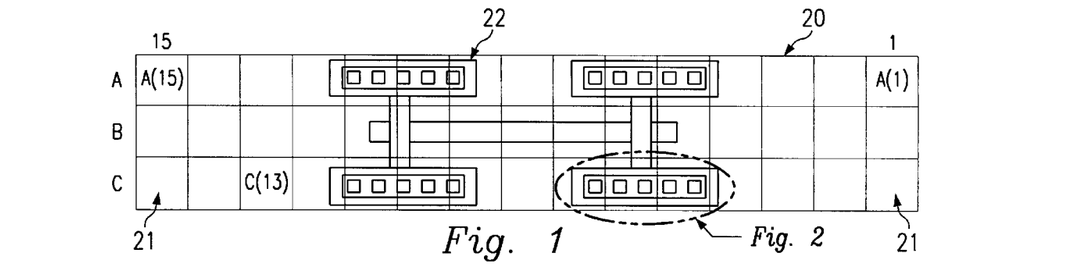
FIG. 1 illustrates a schematic of a two-dimensional circuit pattern overlapping a grid system on an x-y plane.
Figure 2:
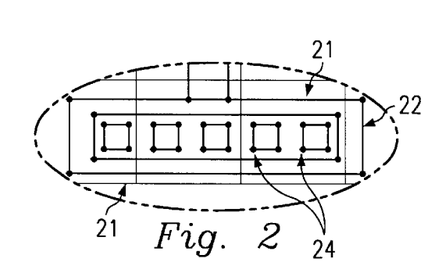
FIG. 2 is a detailed illustration of a portion of the circuit of FIG. 1.
Figure 3:
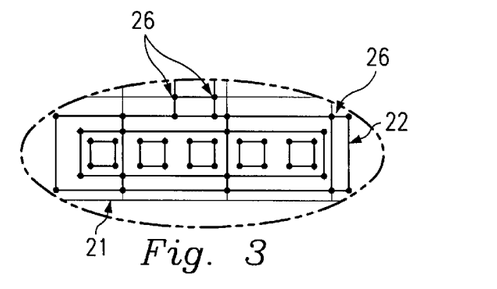
FIG. 3 is a detailed illustration of the portion of the circuit in FIG. 2 where additional intersection or boundary points between the circuit pattern and the grid are identified.

Referring now to FIGS. 1, 2, and 3, a grid system 20 having a plurality of grid segments 21 contains a circuit pattern 22. In one embodiment, the grid system has three rows and fifteen columns (3×15) for the purpose of facilitating one-to-one mapping of the circuit pattern to a mask. The number of columns and rows, as discussed further below, are largely determined by the configuration a photolithography system having a plurality of mirrors, such as one disclosed and explained in the U.S. Pat. No. 6,061,118, which is herein incorporated by reference. The circuit pattern 22 falls within a plurality of the grid segments 21. The grid segments 21 are used as the base units to divide the entire circuit pattern 22 into sections for mapping onto a mask (FIG. 6), which is further projected onto a spherical shaped device as discussed below. A conventional circuit pattern usually defines the design pattern by using multiple polygons, usually rectangles and squares, the boundary of which can be identified by a group of corner points. As shown in FIG. 2, a plurality of critical points 24 are identified that define numerous entities of the circuit pattern. In additional to these critical points 24, boundary points 26, as shown in FIG. 3, which are intersection points between the circuit entities and the grid segments, should also be recognized for mapping purpose. Since each grid segment 21 shares a common boundary with an adjacent segment, the boundary points 26 are normally shared by or meshed with adjacent circuit portions.

For simplifying the mapping process, it is understood that each grid segment 21 has the same size in the two-dimensional grid system. Further, each grid segment 21 is labeled distinctively as follows: A(1), A(2), ..., A(15); B(1), B(2), ..., B(15); C(1), C(2), ..., C(15), whereas the rows are indicated by A, B and C, and columns by numeral (1) to (15). Thus every grid segment 21 can be swiftly and easily identified if needed.

Figure 4:
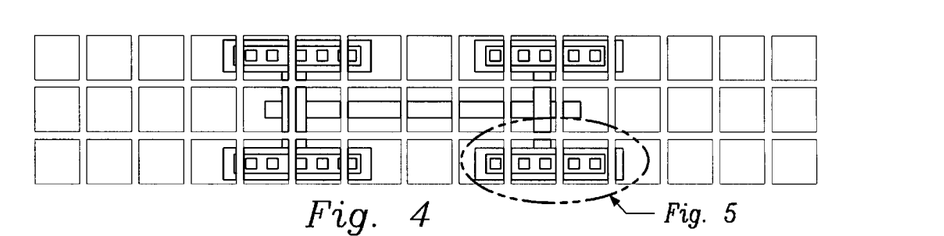
FIG. 4 illustrates a schematic of the two-dimensional circuit pattern of FIG. 1 separated into segments.
Figure 5:
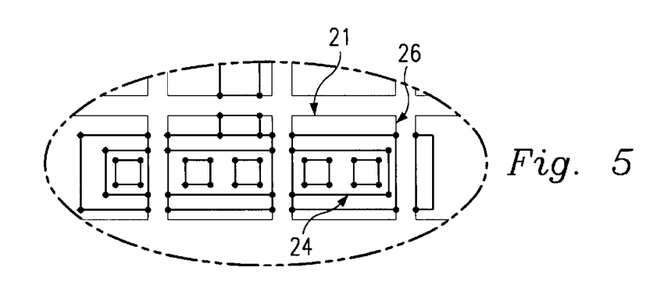
FIG. 5 is a detailed illustration of a portion of the schematic of FIG. 4.

Referring now to FIG. 4, each grid segment 21 containing parts of the circuit 22 is separated from adjacent grid segments. Specifically, FIG. 4 shows specific parts of the circuit 22 enclosed within the grid segments 21, hereinafter referred to as circuit segments. Referring also to FIG. 5, a detailed view of the segmented circuit segments is presented. All the critical points 24 and boundary points 26 are clearly identified.

Figure 6:
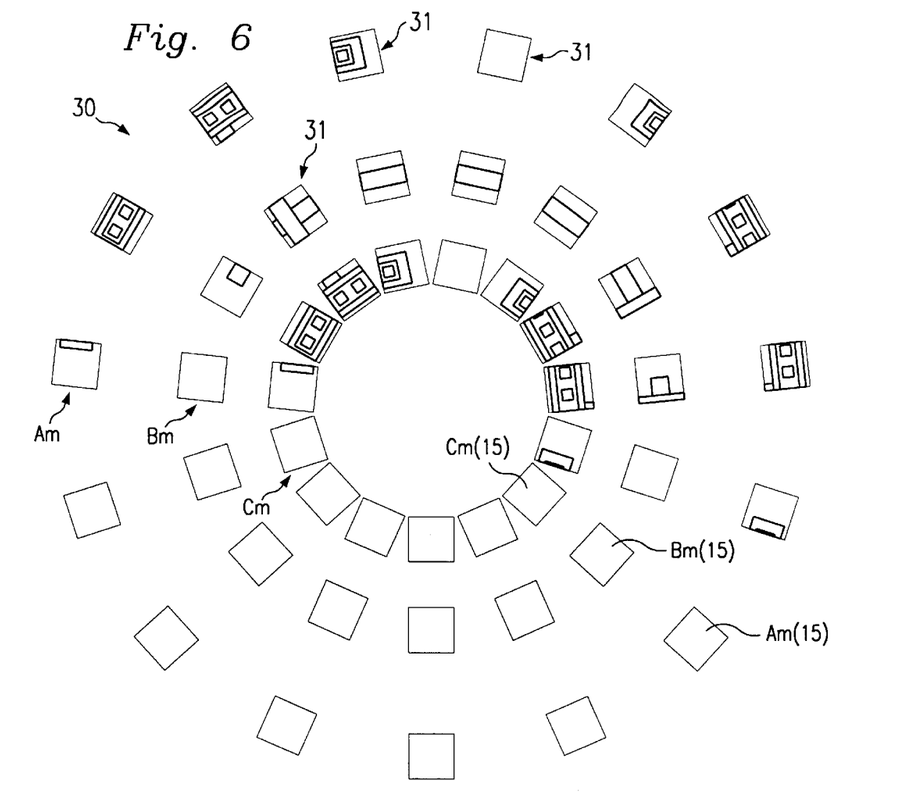
FIG. 6 shows a mask design created by mapping the segments of the circuit pattern of FIG. 1 for projecting the circuit pattern onto a spherical surface.

Turning now to FIG. 6, a layout of a mask 30 is shown with a plurality of mask segments 31 created or mapped from the circuit segments 21 of FIG. 5. The mask segments 31 contain information for projection onto a three-dimensional surface, such as a spherical shape semiconductor device. Each circuit segment 21 is mapped to a mask segment 31 in a unique position on the flat mask 30. In this particular embodiment, the original grid system 20 in FIG. 1 has three rows, A, B and C. After mapping, the mask has correspondingly three orbits Am, Bm, and Cm respectively, wherein each orbit has 15 mask segments 31. FIG. 6 illustrates the mask segments 31 as small squares for the sake of simplicity. However, it is understood that in the preferred embodiment, the mask segments 31 are in distorted shapes. FIGS. 8–11 discuss different shapes for the mask segments, below.

Another feature of the layout of the mask 30 is that the circuit segments .21 originally belonging to the same column are now aligned in the three orbits. For example, A(15), B(15) and C(15) of the grid system 20, are now aligned linearly as Am(15), Bm(15) and Cm(15). This is for the convenience of exposing and projecting the circuit pattern onto the sphere in a photo lithographic process.

Figure 7:
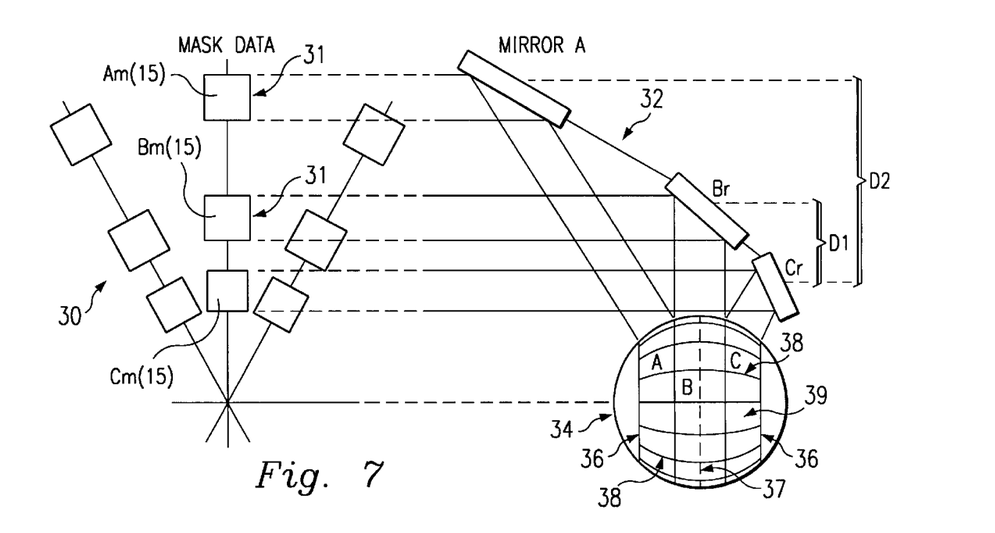
FIG. 7 illustrates a portion of the mask of FIG. 6 illuminated and projected onto a spherical surface using a photolithography system having a plurality of mirrors.

As shown in FIG. 7, when the aligned mask segments 31, such as Am(15), Bm(15) and Cm(15), are exposed to a light source, images or patterns thereon are projected simultaneously on a mirror assembly 32. For the sake of example, the mirror assembly 32 may be of the type described in the above-incorporated U.S. Pat. No. 6,061,118. The mirror assembly 32 is represented, for the sake of simplicity, by three mirrors Ar, Br, and Cr. These mirrors Ar, Br, and Cr reflect three mask segments 31 onto a sphere 34 to form three segments on the sphere. Although not shown, more mirrors corresponding to all the mask segments 31 simultaneously project the remaining mask segments onto the sphere 34. After the projection, three belt shaped areas 36 (hereinafter "belts") are formed in such a way that they occupy a middle section of the sphere 34, much like the stripe around a ball used for pocket billiards.

The boundaries of each belt are small circles parallel to a common great circle. That is, an imaginary great circle 37, shown as a phantom line on the sphere 34 in FIG. 7, resides in the middle of the center belt, and the other two belts are equally spaced from the great circle 37 with boundaries defined by a plurality of small circles. The belts 36 are further segmented by a plurality of great circles 38, which are perpendicular to the great circle 37, to form a plurality of spherical segments 39. These spherical segments 39 corresponds to the mask segments 31 on the mask 30. In this particular embodiment, pattens on mask segments Bm(n) form the center belt, and mask segments Am(n) and Cm(n) form two other belts, on both sides of Bm(n).

In addition, the design of the mask 30 depends largely on the design of the entire photolithography system. For example, if it is determined that three belts on the spherical shaped semiconductor device are desired, then the mask should have only three orbits, and each orbit requires a ring of mirrors as explained in the above mentioned U.S. Pat. No. 6,061,118). Similarly, if a certain number of spherical segment 39 is desired, then each ring of mirrors may have the same number of mirrors, and therefore, each orbit may have the same number of mask segments thereon. Further, the distance between the centers of the mirrors, such as D1 and D2 in FIG. 7, affect the distance necessary between corresponding orbits on the mask 30. Moreover, other factors such as the distance between the mask 30 to the center of the mirrors, the distance between the spherical shaped semiconductor devices and the mirrors, and the configuration of the mirror arrangement, e.g., the angle at which each mirror tilts, all collectively affect the design of the mask.

Figure 8:
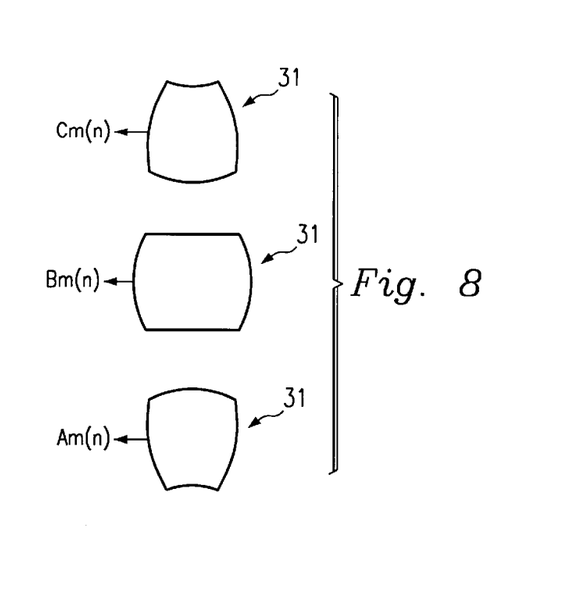
FIG. 8 illustrates a detailed view of three aligned mask segments.

To design the mask 30, the shape of each mask segment 31 should be determined once the orbits and mask segments are determined. FIG. 8 is a detailed view of one group of the aligned mask segments of FIG. 7. Since all the mask segments 31 on a particular orbit share the same shape, the three mask segments shown in FIG. 8 represent all the shapes of the mask segments in this particular case. It can be seen that each mask segment is in a rather distorted shape. Further, each aligned mask segment is maintained a certain distance apart from the other as mentioned above. The distance kept between any two orbits is to prevent "unnecessary" image overlapping of the circuit pattern on the sphere projected from the mask segments of two different orbits.

The shapes of the mask segments 31 bear a certain mathematical relationships with the spherical segments. As shown in FIG. 7, since the shape of each of the spherical segments 39 is a result of the projection of a mask segment through a mirror, a one-to-one relationship can be determined between the boundary lines of the spherical segment 39 and the boundary lines of the mask segment 31. However, this relationship may likely change every time any change has been made to the configuration of the elements of the entire photolithography system, such as the configuration of the mask, the mirrors, and the size of the spherical shaped semiconductor devices.

Through the aid of modern computing tools such as a computer, a series of mathematical calculations can precisely determine the shapes of the mask segments. The objective is to avoid any "unnecessary" image overlapping on the boundary of any two spherical segments 39 on the sphere due to distortion of the circuit pattern on the mask segments 31 after the projection. Certain overlapping on the boundaries of the spherical segments 39 may be desired to merge the circuit pattern on each segment, but no excessive overlapping are desired and the overlapping should be consistent.

Once the shapes of the mask segments are defined, that is, the four corners and four boundary lines of each mask segment are identified, specific mapping operations may occur. Specifically, in order to map the circuit pattern in each circuit segment 21 of FIG. 4 and 5 to a mask segment 31, further mathematical derivations are necessary. Since in this case, only three different types of mask segment logically exist, only three different conversion methods are involved.

Figure 9A:
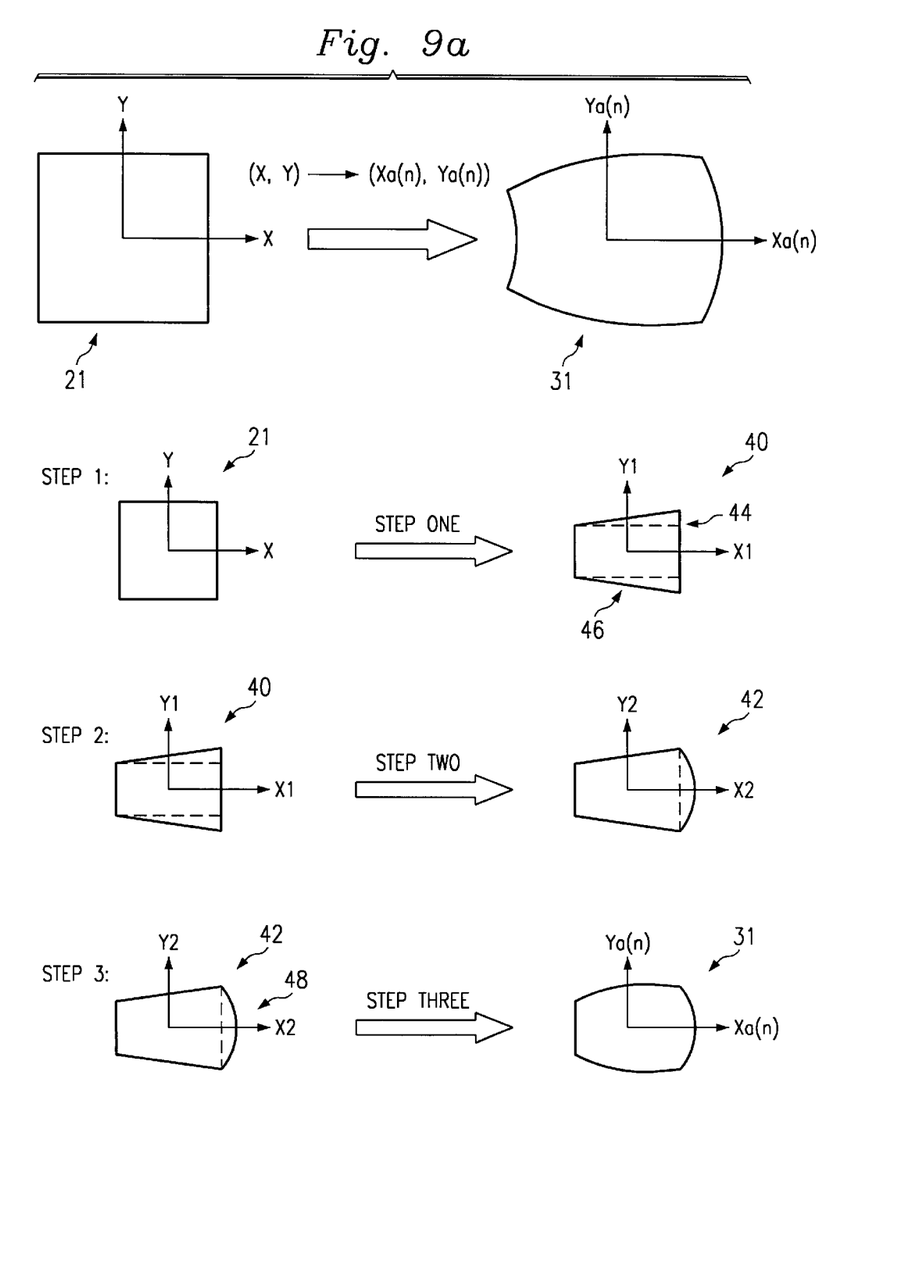
FIG. 9a shows steps to form one type of mask segment in FIG. 6 adjusted for three-dimensional application.
Figure 9B:
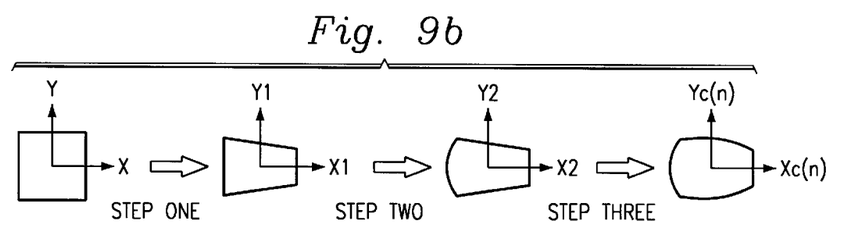
FIG. 9b shows steps to form another type of mask segment in FIG. 6 adjusted for three-dimensional application.
Figure 9C:
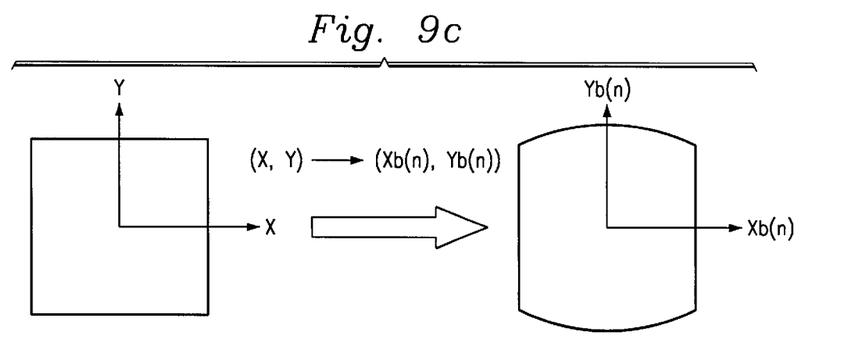
FIG. 9c shows steps to form a third type mask segment type in FIG. 6 adjusted for three-dimensional application.

FIGS. 9a, 9b, and 9c suggest potential steps taken by a computer to form the mask segments on the different orbits. In FIG. 9a, (Xa(n), Ya(n)) denotes the coordinates of any point on one mask segment on the orbit Am. Three intermediate steps are taken to modify the shape of an original circuit segment 21, wherein any point in the circuit segment 21 is represented by (X, Y).

In step one, all four corners of the circuit segment 21 are changed to the known four corners of the mask segment 31. Coordinate (X1, Y1) represents all points in this first intermediate shape 40.

In step two, all the points in the first intermediate shape 40 denoted by coordinate system of (X1, Y1) are formed into a second intermediate shape 42, whereas all the points therein are denoted by the coordinate (X2, Y2). Since only the right side boundary is expanded and curved, all the coordinates in the Y1 or Y2 direction do not change; only the coordinates in the X1 or X2 direction change. Two sets of mathematical formulas can be found to represent the changes. One is for the points in the center area bound by the phantom lines 44 and 46 inclusive, and the another for all the points above the line 44 or below the line 46.

Finally, in step three, the top and bottom boundaries of the second intermediate shape 42 can be expanded and curved to obtain the desired mask segment 31 of orbit Am. If the orbit is the outer most orbit, the left side boundary of the second intermediate shape 42 does not need to change since, after the projection, there will be no overlapping with any neighboring spherical segments on that boundary. Consequently only one set of mathematical formulas is needed for points on the left of the phantom line 48. In FIG. 9b, similar changes are made to the mask segments of orbit Cm. Since orbit Am and Cm reside equidistant on opposite sides of the "equator" of the spherical shaped semiconductor device, the overall shape of the mask segments on orbit Cm are basically mirror images of the mask segments on orbit Am, although the data contained in each mask segment may be different. Thus similar intermediate steps are suggested to map any point, with the only difference being the left, top and bottom boundaries. If FIG. 9c, for the mask segments on orbit Bm, since only the top and bottom boundaries need to be changed into curves, only one step is taken to achieve the final result and consequently only one mathematical formula is involved.

For the sake of illustration, some detailed mathematical formulas are provided below to explain the transformation from the circuit segments 21 to the mask segments 31. It is understood, however, that the formulas are for a specific embodiment and for a specific configuration of the entire photolithography system, and are not intended to limit the invention.

Figure 10:
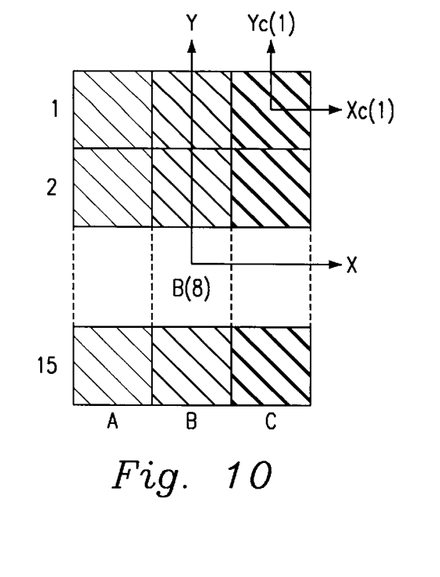
FIG. 10 presents a close view of the grid system of FIG. 1 with a coordinate system imposed thereon.

Now turning to FIG. 10, as described above relating to FIG. 1, in order to generated the mask 30, the grid 20 is divided into 3×15 circuit segments 21. It is assumed that each circuit segment 21 is a 209.4×209.4 μm square. Accordingly, in the grid system, the center point of each segment 21 can be assigned with a unique coordinate. For the sake of reference, the origin of the coordinate system is set at the center segment B(8) having the coordinates (X, Y). Thus, the center of segment C(1) has coordinate (Xc(1), Yc(1)), which is a displacement from the origin according to the following equation:

$$Xc(1) = X + 209.4 \text{ μm} \quad \text{equation (1)}$$

$$Yc(1) = Y + 7 \times 209.4 \text{ μm} \quad \text{equation (2)}$$

Consequently, the coordinates for the center points of the circuit segments 21 on column A, B and C can be generally represented as follows:

$$Xa(n) = X - 209.4 \quad \text{equation (3)}$$

$$Xb(n) = X \quad \text{equation (4)}$$

$$Xc(n) = X + 209.4 \quad \text{equation (5)}$$

$$Ya(n) = Yb(n) = Yc(n) = Y - 209.4(n-8) \quad \text{equation (6)}$$

where n=1, 2, ..., 15 and wherein all distances are measured in μm.

In a particular circuit segment, the span of of the circuit segments 21 parallel to the X axis is determined as follows:

A(n): $-0.5 \text{ L} > X \geq -1.5 \text{ L}$

B(n): $0.5 \text{ L} > X \geq -0.5 \text{ L}$

C(n): $1.5 \text{ L} \geq X \geq 0.5 \text{ L}$ and the span of the segments 21 along the Y axis is as shown below:

A(1), B(1), C(1): $7.5 \text{ L} \geq Y \geq 6.5 \text{ L}$

A(2), B(2), C(2): $6.5 \text{ L} > Y \geq 5.5 \text{ L}$

A(3), B(3), C(3): $5.5 \text{ L} > Y \geq 4.5 \text{ L}$

A(4), B(4), C(4): $4.5 \text{ L} > Y \geq 3.5 \text{ L}$

A(5), B(5), C(5): $3.5 \text{ L} > Y \geq 2.5 \text{ L}$

A(6), B(6), C(6): 2.5 L>Y≧1.5 L

A(7), B(7), C(7): 1.5 L>Y≧0.5 L

A(8), B(8), C(8): 0.5 L>Y≧−0.5 L

A(9), B(9), C(9): −0.5 L>Y≧−1.5 L

A(10), B(10), C(10): −1.5 L>Y≧−2.5 L

A(11), B(11), C(11): −2.5 L>Y≧−3.5 L

A(12), B(12), C(12): −3.5 L>Y≧−4.5 L

A(13), B(13), C(13): −4.5 L>Y≧−5.5 L

A(14), B(14), C(14): −5.5 L>Y≧−6.5 L

A(15), B(15), C(15): −6.5 L>Y≧−7.5 L where L=209.4 μm, and n=1, 2, . . . , 15.

Just as each circuit segment 21 has a unique coordinate, each spherical segment 39 also has a unique absolute coordinate. Since, in this case, there are 15 columns on original grid 20, and thus a belt needs to be sliced by the great circles into 15 segments, the center of a spherical segment 39 is therefore set apart from the adjacent segments by 24 degrees (360 degrees/15=24 degrees) with respect to the center of the sphere.

Figure 11A:
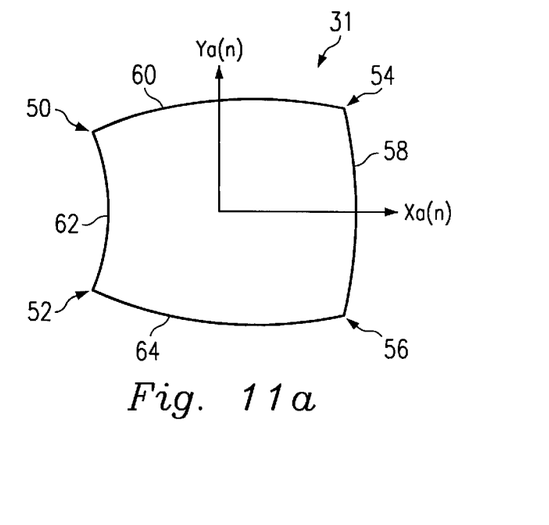
FIG. 11a illustrates the boundary conditions of a first type of mask segments of FIG. 6.

FIG. 11a shows a mask segment 31 on orbit Am with a mesh system established for facilitating the mapping of a corresponding circuit segment 21. With respect to the coordinates, the locations of four corner points are:

Point 50: Xa(n)=−107.551 μm, Ya(n)=84.102 μm

Point 52: Xa(n)=−107.551 μm, Ya(n)=−84.102 μm

Point 54: Xa(n)=99.609 μm, Ya(n)=101.684 μm

Point 56: Xa(n)=99.609 μm, Ya(n)=−101.684 μm And the curved boundary lines or sides can be represented to be:

$(Xa(n)+94.969)^2/(198.925)^2+Ya^2(n)/(489.074)^2=1$  Side 58:

$[(Xa(n)/\cos(24°)-Ya(n)\tan(24°)/\tan(12°)]^2+Ya^2(n)/\sin^2(12°)=500^2$  Side 60:

$(Xa(n)+268.485)^2/(164.529)^2+Ya^2(n)/(404.509)^2=1$  Side 62:

$[(Xa(n)/\cos(24°)+Ya(n)\tan(24°)/\tan(12°)]^2+Ya^2(n)/\sin^2(12°)=500^2$  Side 64:

whereas the number 500 μm represents the radius of the spherical shaped semiconductor device.

Figure 11B:
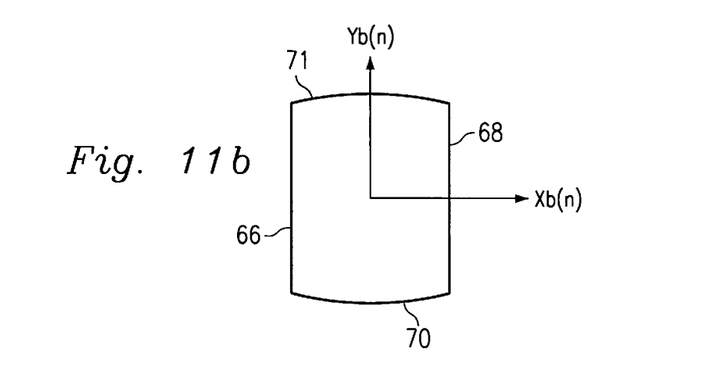
FIG. 11b illustrates the boundary conditions of a second type of mask segments of FIG. 6
Figure 11C:
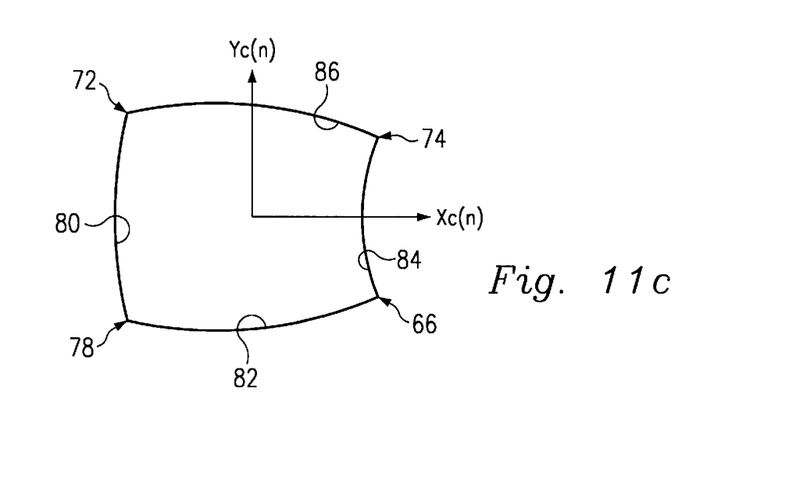
FIG. 11c illustrates the boundary conditions of a third type of mask segments of FIG. 6.

Similarly for mask segments on orbit Bm as shown in FIG. 11b, the boundary conditions are as follows:

$|Xb(n)|=103.95$ μm  Side 66, 68:

$|Yb(n)|=0.2079\ [500^2-Xb^2(n)]^{1/2}+0.007456$ μm  Side 70, 71:

With respect to FIG. 11c, a mask segment on orbit Cm is shown, and the corners are located at:

Point 72: Xc(n)=−99.609 μm, Yc(n)=101.684 μm

Point 74: Xc(n)=107.551 μm, Yc(n)=84.102 μm

Point 76: Xc(n)=107.551 μm, Yc(n)=−84.102 μm

Point 78: Xc(n)=−99.609 μm, Yc(n)=−101.684 μm and the curved boundary lines or sides are at:

$(Xc(n)-94.969)^2/(198.925)^2+Yc^2(n)/(489.074)^2=1$  Side 80:

$(Xc(n)-268.485)^2/(164.529)^2+Yc^2(n)/(404.509)^2=1$  Side 84:

$[Xc(n)/\cos(24°)-Yc(n)\tan(24°)/\tan(12°)]^2+Yc^2(n)/\sin^2(12°)=500^2$  Side 82:

$[Xc(n)/\cos(24°)+Yc(n)\tan(24°)/\tan(12°)]^2+Yc^2(n)/\sin^2(12°)=500^2$  Side 86:

With the above formula and the four corner points, the advanced computer should be able to draw the boundary lines of the mask segments 31 on all the orbits.

Referring again to FIGS. 9a, 9b, and 9c, for a computer to change the polygon shape of the circuit segments 21 to the irregular mask segment 31, mathematical calculation must be involved. Again, for purpose of illustration, the following formulas are presented to reflect only one configuration of the system. Specifically, in FIG. 9a, to convert the circuit segment A(n) of the grid 20 to a mask segment 31 on orbit Am through intermediate steps, the following formulas are used:

Step 1: From (X, Y) to (X1, Y1)

$X1=0.9893\ X-3.971$  (a1)

$Y1=Y(0.0008019\ X+0.8872)$  (a2)

Step 2: From (X1, Y1) to (X2, Y2)

$Y2=Y1$  (a3)

when $|Y1| \leq 84.102$ μm (i.e., for points in the center area bound by the phantom lines 44 and 46 including the lines):

$X2=[G(Y1)/207.16](X1+107.551)-107.551$  (a4)

where $G(Y1)=12.582+198.925\ [1-Y1^2/(489.074)^2]^{1/2}$ when $|Y1|>84.102$ μm (i.e., for the points in the area above the phantom lines 44 or below line 46):

$X2=H(Y1)(X1-J(Y1)/(99.609-J(Y1))+J(Y1)$  (a5)

where $H(Y1)=1003.5142-11.7825\ |Y|+198.925\ [1-Y1^2/(489.074)^2]^{1/2}$ $J(Y1)=11.7825\ |Y1|-1098.4827$ Step 3: (X2, Y2) to (Xa(n), Ya(n))

$Xa(n)=X2$  (a6)

when $X2 \leq 99.609$ μm (i.e., for points left of or on the phantom line 48):

$Ya(n)=[K(X2)/N(X2)]Y2$  (a7)

where $N(X2)=0.8487\ X2+93.230$ $K(X2)=[-b+(b^2-4ac)^{1/2}]/(2a)$ and $a=\sin^{-2}(12°)[1+\cos^2(12°)\tan^2(24°)]=27.5210$
$b=-2X2\ \tan(24°)/[\tan(12°)\cos(24°)]=-4.58573\ X2$
$c=X2^2/\cos^2(24°)-500^2=1.19822\ X2^2-250000$ when $X2>99.609$ μm (i.e., for the points right of the phantom line 48):

$Ya(n)=Y2$  (a8)

For FIG. 9b, the mathematical representations for converting the circuit segment B(n) to the mask segments Bm(n) are show below:

$Xb(n)=0.99284\ X$  (b1)

$Yb(n)=(Y/104.7)[0.20791\ (500^2-X^2)^{1/2}+0.007456]$  (b2)

For circuit segments C(n), similar to the conversion of segments A(n) as shown in FIG. 9a, three steps are taken from circuit segment (X, Y) to (Xc(n), Yc(n)) on the flat mask:

Step 1: From (X, Y) to (X1, Y1)

$X1=0.9893\ X+3.971$  (c1)

$Y1=Y(-0.0008019\ X+0.8872)$  (c2)

Step 2: From (X1, Y1) to (X2, Y2)

$$Y2=Y1 \quad (c3)$$

when $|Y1| \leq 84.102 \, \mu m$, $$X2=[G(Y1)/207.16](X1-107.551)+107.551 \quad (c4)$$

where $G(Y1)=12.582+198.925 \, [1-Y1^2/(489.074)^2]^{1/2}$
when $|Y1|>84.102 \, \mu m$, $$X2=H(Y1)(X1+J(Y1)/(99.609-J(Y1))-J(Y1) \quad (c5)$$

where $H(Y1)=1003.5142-11.7825 \, |Y1|+198.925 \, [1-Y1^2/(489.074)^2]^{1/2}$
$J(Y1)=11.7825 \, |Y1|-1098.4827$
Step 3: From (X2, Y2) to (Xc(n), Yc(n))

$$Xc(n)=X2 \quad (c6)$$

when $X2 > -99.609 \, \mu m$, $$Yc(n)=[K(X2)/N(X2)]Y2 \quad (c7)$$

where $N(X2)=-0.8487 \, X2+93.230$
$K(X2)=[-b+(b^2-4ac)^{1/2}]/(2a)$
and $a=\sin^{-2}(12°) \, [1+\cos^2(12°)\tan^2(24°)]=27.5210$
$b=2X2 \, \tan(24°)/[\tan(12°)\cos(24°)]=4.58573 \, X2$
$c=X2^2/\cos^2(24°)-500^2=1.19822 \, X2^2-250000$
when $X2 \leq -99.609 \, \mu m$ $$Ya(n)=Y2 \quad (c8)$$

Using these relationships, the two-dimensional design can be segmented and mapped onto a flat mask for three dimensional projection. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for generating a photolithography mask from a conventional, two dimensional design pattern, the method comprising the steps of:
    segmenting the design pattern into a plurality of intersecting polygonal design segments;
    determining a displacement formula for mapping each design segment to a plurality of coplanar mask segments with curved boundaries, the curved boundaries of the mask segments being shaped to expose a belt when light is projected through the mask segments, reflected off a multifaceted mirror assembly, and exposed onto a spherical substrate; and
    mapping each design segment onto the plurality of mask segments, based on the displacement formula, so that the plurality of mask segments are co-planar.

2. The method of claim 1 wherein the step of segmenting further includes the steps of:
    imposing a grid system, wherein boundaries of the design segment are defined by a polygonal shape base unit of the grid system; and
    identifying a plurality of points at which the segmented design intersect with the boundaries of the polygonal shape base unit, the intersect points representing connections of the design pattern between adjacent design segments,
    wherein the plurality of points are mapped to boundaries of adjacent mask segments to prevent unnecessary image overlapping, yet still enabling the connections of the design patterns.

3. The method of claim 1 wherein the mask segments are on a plurality of radially concentric orbits on the mask.

4. The method of claim 1 wherein the number of mask segments is predetermined by the configuration of the multifaceted mirror assembly.

5. The method of claim 1 wherein the step of mapping further includes the steps of:
    determining boundary conditions of the mask segments; and
    mapping each design pattern of each design segment onto the corresponding mask segment by using an intermediate graphic entity according to the boundary conditions of the mask segments;
    wherein the boundary conditions of the mask segments are determined to prevent unnecessary overlapping of the mask segment after being projected onto the spherical substrate.

6. A method for generating a mask from a conventional circuit design, the mask being usable for manipulating a light projection to thereby expose the circuit design onto a curved surface of a semiconductor device, the method comprising the steps of:
    imposing a grid system on the circuit design, the grid system having a first number of columns and a second number of rows, thereby forming a plurality of grid segments;
    segmenting the circuit design into a plurality of circuit segments, wherein each circuit segment is enclosed in one grid segment;
    defining the circuit segments as a plurality of critical points and boundary points;
    creating a plurality of coplanar mask segments, each mask segment being sized by circles that correspond to portions of the curved surface of the semiconductor device, the number of circles equaling the second number of rows plus one;
    determining a displacement formula for mapping the plurality of critical points and boundary points to corresponding points on the mask segments; and
    mapping each critical point onto one corresponding mask segment and each boundary point onto two adjacent mask segments according to the displacement formula.

7. The method of claim 6 wherein the mask segments are arranged on a plurality of orbits, corresponding to the number of rows, each orbit spaced at a uniform distance.

8. The method of claim 7 wherein the grid segments from the same row in the grid system correspond to mask segments that reside on the same orbit and the boundaries correspond to the same circle.

9. The method of claim 7 wherein the mask segments mapped from the grid segments of the same column are perpendicularly aligned with at least one circular orbit.

10. The method of claim 6 wherein the semiconductor device is spherical and the circles are parallel to each other.

11. A system for generating a mask from a circuit design, the mask being usable for manipulating a light projection to thereby expose the circuit design onto a spherical surface of a semiconductor device, the system comprising:
    means for imposing a grid system on the circuit design, the grid system having a plurality of rectangular grid segments;

means for segmenting the circuit design with the grid system into a plurality of circuit segments, wherein each circuit segment is enclosed in a corresponding grid segment;

means for identifying a plurality of critical points defining a portion of the circuit design for each circuit segment and a plurality of intersection points in each grid segment at which the circuit segment crosses boundaries of the grid segment;

means for establishing a plurality of coplanar mask segments, each mask segment having at least one boundary that corresponds with a circle of the spherical surface and each mask segment corresponding to one grid segment according to a displacement formula; and means for mapping the critical points for one circuit segment to corresponding points of a corresponding mask segment onto the mask.

12. The system of claim 11 wherein the mask segments with boundaries corresponding to a circle of the spherical surface are positioned on the mask a uniform distance from each other.

13. The system of claim 11 wherein at least two adjacent mask segments have boundaries that correspond to orbits having different diameters from a center point of the mask.

14. The system of claim 11 wherein a plurality of the grid segments are on a same row in the grid system, and the corresponding mask segments reside on a same orbit of the mask.

15. The system of claim 11 wherein the grid system has a number of rows and two grid segments from the same row share at least one common boundary point.

16. A system for projecting a circuit design onto a surface of a spherical device, said system comprising:

a light source for projecting a light;

a mask having a plurality of separate but coplanar mask segments thereon contain information of the circuit design, each mask segment having a boundary defined by at least one circle of the surface of the spherical device; and a mirror assembly having a plurality of mirror segments for reflecting light onto the spherical device;

wherein the light source, mask, and mirror assembly are positioned so that the light can pass through the mask, reflect off of the mirror assembly, and expose the circuit design onto the surface of the spherical device so that there is no unnecessary overlapping at the boundaries of the images projected from any two mask segments.

17. The system of claim 16 wherein the circuit design is divided into a plurality of circuit segments that are mapped to the mask segments.

18. The system of claim 16 wherein the mask has a plurality of concentric orbits, and where the plurality of mask segments reside on the orbits and have prescribed distances maintained from neighboring mask segments.

19. The system of claim 18 wherein each of the orbits has the same number of mask segments.

20. The system of claim 18 wherein the mask segments on each of the orbits are radially aligned.

21. The system of claim 16 wherein the mirror assembly has the same number of mirror segments as the number of mask segments for projecting the circuit design on to the spherical device.

* * * * *